United States Patent
Nakamura et al.

(10) Patent No.: US 7,965,155 B2
(45) Date of Patent: Jun. 21, 2011

(54) SURFACE ACOUSTIC WAVE RESONATOR, AND SURFACE ACOUSTIC WAVE FILTER AND ANTENNA DUPLEXER IN WHICH THE SURFACE ACOUSTIC WAVE RESONATOR IS USED

(75) Inventors: Hiroyuki Nakamura, Osaka (JP); Hidekazu Nakanishi, Osaka (JP); Yukio Iwasaki, Osaka (JP); Ken Matsunami, Osaka (JP); Tetsuya Tsurunari, Osaka (JP)

(73) Assignee: Panasonic Corporation, Osaka (JP)

( * ) Notice: Subject to any disclaimer, the term of this patent is extended or adjusted under 35 U.S.C. 154(b) by 412 days.

(21) Appl. No.: 12/094,324

(22) PCT Filed: Dec. 14, 2007

(86) PCT No.: PCT/JP2007/074084
§ 371 (c)(1),
(2), (4) Date: May 20, 2008

(87) PCT Pub. No.: WO2008/078573
PCT Pub. Date: Jul. 3, 2008

(65) Prior Publication Data
US 2010/0219905 A1    Sep. 2, 2010

(30) Foreign Application Priority Data
Dec. 27, 2006   (JP) .................... 2006-351247

(51) Int. Cl.
*H03H 9/64*    (2006.01)
*H03H 9/72*    (2006.01)
(52) U.S. Cl. ...... 333/133; 333/193; 333/195; 310/313 B

(58) Field of Classification Search .......... 333/193–196, 333/133; 310/313 B, 313 D
See application file for complete search history.

(56) References Cited

U.S. PATENT DOCUMENTS

| | | | |
|---|---|---|---|
| 4,978,879 A | | 12/1990 | Satoh et al. |
| 4,999,535 A | * | 3/1991 | Mariani et al. ............ 310/313 B |
| 6,121,860 A | * | 9/2000 | Tsutsumi et al. ............ 333/195 |
| 6,791,237 B2 | * | 9/2004 | Yamanouchi ............ 310/313 R |

(Continued)

FOREIGN PATENT DOCUMENTS

JP    61-062221    3/1986

(Continued)

OTHER PUBLICATIONS

Partial English language translation of JP 61-62221 published Mar. 1986.

(Continued)

*Primary Examiner* — Barbara Summons
(74) *Attorney, Agent, or Firm* — Wenderoth, Lind & Ponack, L.L.P.

(57) ABSTRACT

The present invention provides a surface acoustic wave resonator capable of improving a leak of a surface acoustic wave in the transverse direction and reducing the spurious and having superior characteristics. In a surface acoustic wave filter according to the present invention, an interdigital transducer electrode and reflector electrodes are formed on a piezoelectric substrate, and a $SiO_2$ thin film is formed on at least a portion of the interdigital transducer electrode. The interdigital transducer electrode includes a bus-bar electrode region, a dummy electrode region and a finger overlap region, such that the $SiO_2$ thin film is removed from upper sections of the bus-bar electrode regions of the interdigital transducer electrode.

17 Claims, 15 Drawing Sheets

U.S. PATENT DOCUMENTS

| | | | |
|---|---|---|---|
| 6,946,931 B2 * | 9/2005 | Inoue et al. | 333/195 |
| 7,453,334 B1 * | 11/2008 | Abbott et al. | 333/195 |
| 2002/0044497 A1 | 4/2002 | Kachi et al. | |
| 2005/0110367 A1 * | 5/2005 | Kondratiev | 310/313 B |

FOREIGN PATENT DOCUMENTS

| | | | | |
|---|---|---|---|---|
| JP | 03-158014 | * | 7/1991 | 333/193 |
| JP | 5-335879 | | 12/1993 | |
| JP | 06-152299 | * | 5/1994 | 333/240 |
| JP | 6-164297 A | | 6/1994 | |
| JP | 10-022765 | * | 1/1998 | |
| JP | 10-303681 | * | 11/1998 | |
| JP | 2002-084162 | | 3/2002 | |
| JP | 2003-209458 | | 7/2003 | |

OTHER PUBLICATIONS

Partial English language translation of JP 6-164297 published Jun. 1994.

* cited by examiner

SURFACE ACOUSTIC WAVE RESONATOR, AND SURFACE ACOUSTIC WAVE FILTER AND ANTENNA DUPLEXER IN WHICH THE SURFACE ACOUSTIC WAVE RESONATOR IS USED This application is a U.S. national phase application of PCT International Application PCT/JP2007/074084, filed Dec. 14, 2007

BACKGROUND OF THE INVENTION

1. Field of the Invention

The present invention relates to a surface acoustic wave resonator, and a surface acoustic wave filter and an antenna duplexer in which the surface acoustic wave resonator is used.

2. Background of the Invention

In order to realize a surface acoustic wave filter advantageously characterized in its broadband, a piezoelectric substrate having a large electromechanical coupling coefficient, such as a lithium niobate substrate ($LiNbO_3$), was conventionally used. However, the surface acoustic wave filter, in which the substrate of this type is used, was generally disadvantageous because of its poor temperature characteristic. In order to improve the temperature characteristic, there is a proposed constitution wherein a $SiO_2$ thin film layer is formed on the $LiNbO_3$ substrate, and a value of H/λ is 0.115-0.31 provided that a cut angle of a rotor Y-cut as the $LiNbO_3$ substrate is −10 to +30 degrees, a thickness dimension of the thin-film layer is H, and a wavelength of an operation center frequency of the surface acoustic wave is λ (for example, see the Patent Document 1).

When the surface acoustic wave resonator, which is formed on the substrate is connected to the ladder type, the surface acoustic wave filter having the broadband characteristic can be realized. In the case where the substrate of the foregoing type is used, there may be the spurious in the transverse mode. A conventional method of controlling the spurious is to weight an interdigital transducer electrode. FIG. 15A is a top view of a constitution of a conventional surface acoustic wave resonator. FIG. 15B is a sectional view of 15B-15B part shown in FIG. 15A. Interdigital transducer electrode 1202 and reflector electrodes 1203 are formed on piezoelectric substrate 1201, and $SiO_2$ thin film 1204 is further formed thereon. Interdigital transducer electrode 1202 is apodization-weighted in order to control the spurious in the transverse mode.

However, the conventional surface acoustic wave resonator has a problem that the characteristics thereof are deteriorated by the leak of the surface acoustic wave in the transverse direction resulting from an acoustic velocity in the surface acoustic wave resonator. Further, in the case where the surface acoustic wave filter comprises the surface acoustic wave resonator, an insertion loss and a deteriorated attenuation characteristic are unfavorably generated in the surface acoustic wave filter.

[Patent Document 1] Unexamined Japanese Patent Publication No. 2003-209458.

BRIEF SUMMARY OF THE INVENTION

Therefore, a main object of the present invention is to solve the foregoing problems, and a main object thereof is to provide a surface acoustic wave resonator superior in its characteristics by improving the leak of a surface acoustic wave, and a surface acoustic wave filter and an antenna duplexer in which the surface acoustic wave resonator is used. The present invention relates to a surface acoustic wave resonator comprising a substrate made of lithium niobate, an interdigital transducer electrode provided on an upper surface of the substrate, and a dielectric thin film for covering the interdigital transducer electrode. The interdigital transducer electrode includes bus-bar electrode regions, dummy electrode regions and a finger overlap region, wherein a thickness of the dielectric thin film in upper sections in at least one of the bus-bar electrode regions and the dummy electrode regions is smaller than the thickness of the dielectric thin film above of the finger overlap region. According to the constitution, the leak of the surface acoustic wave in the transverse direction can be effectively improved, and the surface acoustic wave resonator superior in its characteristics can be thereby realized. Further, in the case where the surface acoustic wave resonator is provided in the surface acoustic wave filter and the antenna duplexer, the surface acoustic wave filter and the antenna duplexer can also have superior characteristics.

DETAILED DESCRIPTION OF THE INVENTION

Figure 1A:
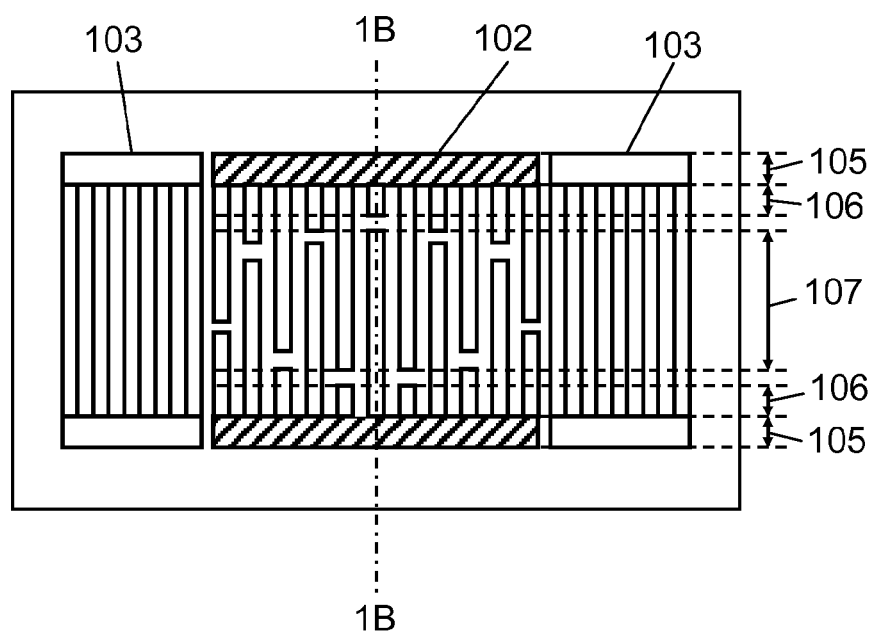
FIG. 1A is a top view of a constitution of a surface acoustic wave resonator according to a preferred embodiment 1 of the present invention.

Hereinafter, preferred embodiments of the present invention are described referring to the drawings.

Preferred Embodiment 1

Figure 1B:
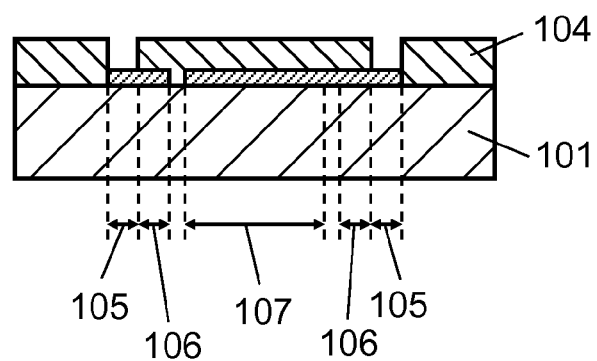
FIG. 1B is a sectional view of the constitution of the surface acoustic wave resonator according to the preferred embodiment 1.

FIG. 1A is a top view showing a constitution of a surface acoustic wave resonator according to a preferred embodiment 1 of the present invention. FIG. 1B is a sectional view of 1B-1B shown in FIG. 1A. Interdigital transducer electrode 102 and reflector electrodes 103 are formed on piezoelectric substrate 101, and $SiO_2$ thin film 104 is further formed thereon. Interdigital transducer electrode 102 includes bus-bar electrode regions 105, dummy electrode regions 106 and finger overlap region 107. Interdigital transducer electrode 102 is apodization-weighted in order to control the spurious in the transverse mode. Dummy electrode region 106 denotes a region representing a minimum length of a dummy electrode in interdigital transducer electrode 102, while finger overlap region 107 denotes a region representing a crossover maximum length in interdigital transducer electrode 102. Further, $SiO_2$ thin film 104 is removed so that the electrodes are exposed in upper sections of bus-bar electrode regions 105 of interdigital transducer electrode 102, which means that a thickness of $SiO_2$ thin film 104 is zero therein.

Figure 2:
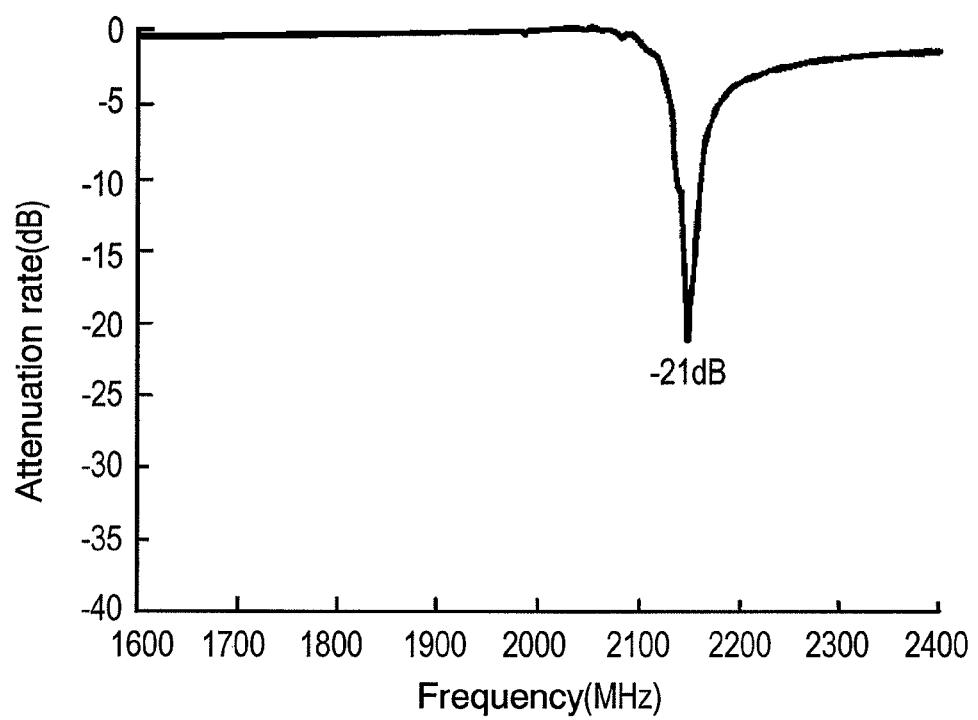
FIG. 2 is an attenuation rate chart of the surface acoustic wave resonator according to the preferred embodiment 1.
Figure 15A:
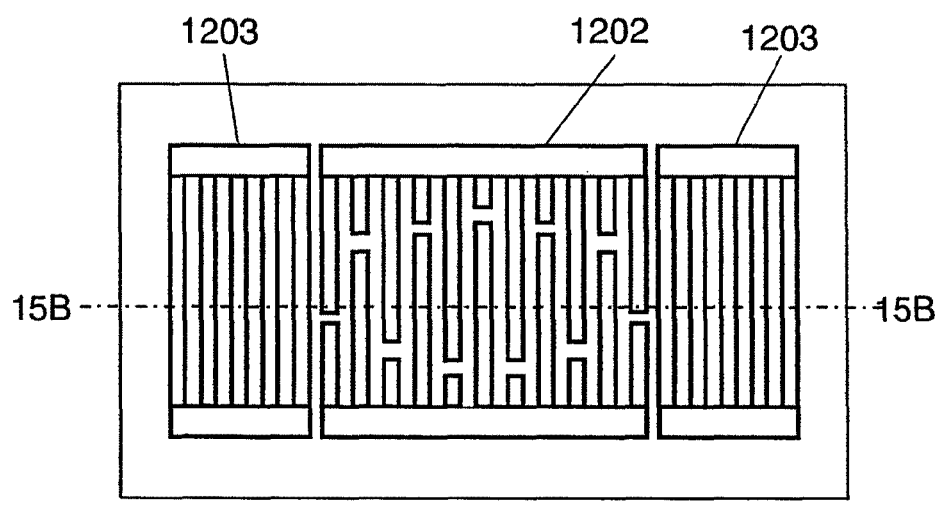
FIG. 15A is a top view of a constitution of a conventional surface acoustic wave resonator.
Figure 15B:
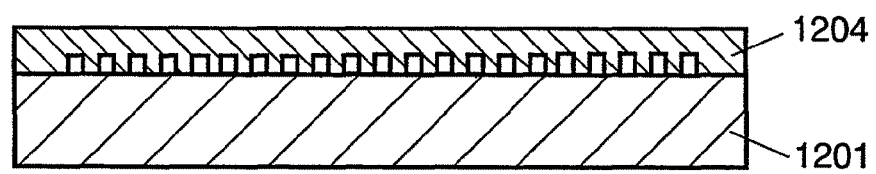
FIG. 15B is a sectional view of the constitution of the conventional surface acoustic wave resonator.
Figure 16:
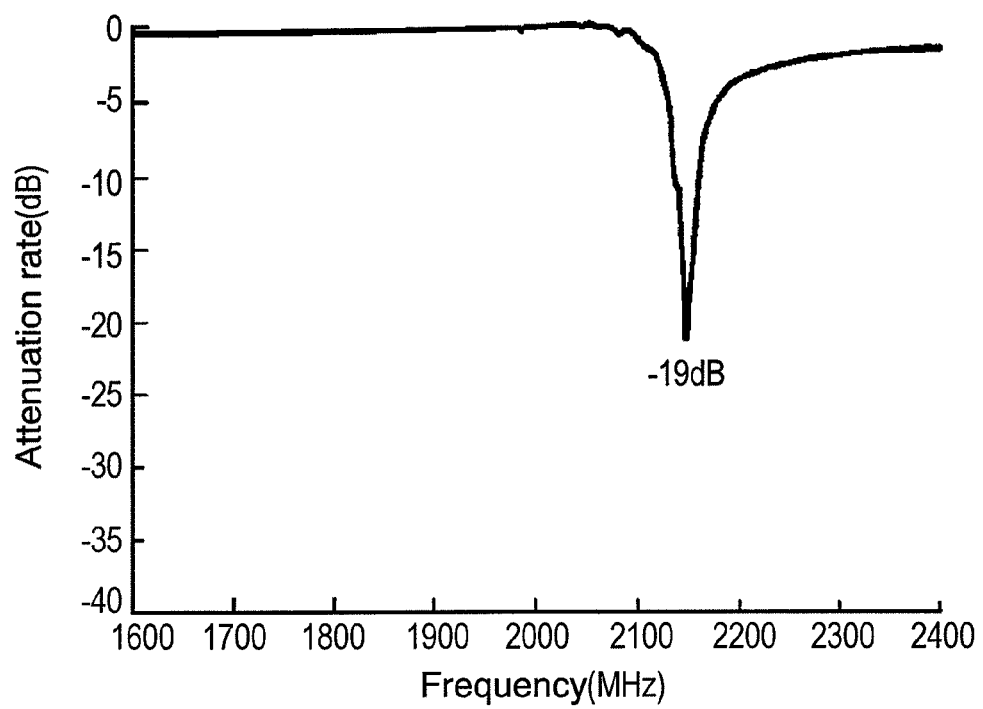
FIG. 16 is an attenuation rate chart of the conventional surface acoustic wave resonator.

FIG. 2 shows a frequency versus attenuation rate of the surface acoustic wave resonator. Further, FIG. 16 shows an attenuation rate of the conventional surface acoustic wave resonator shown in FIGS. 15A and 15B for comparison. As piezoelectric substrate 101 is used a $LiNbO_3$ substrate which is a rotor (rotary) Y-cut substrate having the cut degree of five degrees. A material including Al as its main constituent is used for the electrodes. The film thicknesses of the electrode and $SiO_2$ thin film 104 show values normalized by a wavelength, which are respectively 8% and 20%. As shown in FIGS. 2 and 16, a maximum attenuation in the surface acoustic wave resonator according to the present invention is −21 dB, while the maximum attenuation in the conventional surface acoustic wave resonator is −19 dB. The improvement of the characteristics of the surface acoustic wave resonator according to the present invention is thereby confirmed. Referring to the Q value at an anti-resonance frequency, the Q value is 230 in the surface acoustic wave resonator according to the present invention, while the Q value in the conventional surface acoustic wave resonator is 194. Thus, the improvement of the resonator characteristics is achieved. The possible reason for the improvement is that an acoustic velocity of the surface acoustic wave in bus-bar electrode regions 105 is faster than the acoustic velocity in finger overlap region 107 in the surface acoustic wave resonator because $SiO_2$ thin film 104 in the upper sections of bus-bar electrode regions 105 is removed so that the electrodes are exposed, which controls the leak of the surface acoustic wave in the transverse direction, in other words, in the direction of the bus-bar electrodes, thereby allowing the surface acoustic wave to be more effectively contained.

As so far described, in the surface acoustic wave resonator according to the present invention, wherein $SiO_2$ thin film 104 in the upper sections of bus-bar electrode regions 105 in interdigital transducer electrode 102 is removed, the characteristics of the surface acoustic wave resonator can be improved, and the surface acoustic wave resonator which is superior can be thereby realized.

In order to remove the $SiO_2$ thin film, etching may be adopted after the $SiO_2$ thin film is formed, or the upper sections of bus-bar electrode regions 105 in interdigital transducer electrode 102 may be masked before the $SiO_2$ thin film is formed so that the $SiO_2$ thin film cannot be formed.

Figure 3A:
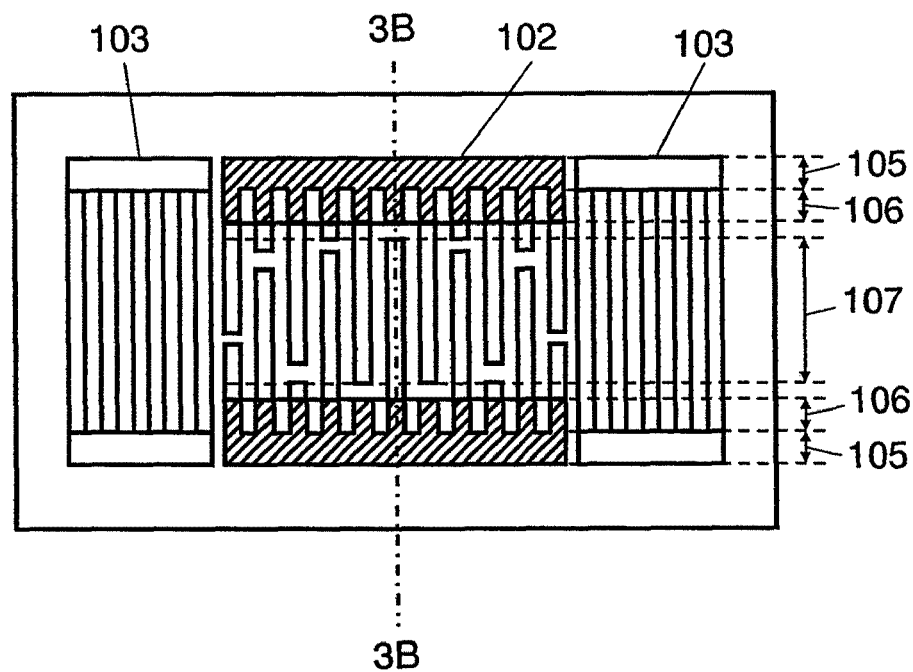
FIG. 3A is a top view of another constitution of the surface acoustic wave resonator according to the preferred embodiment 1.
Figure 3B:
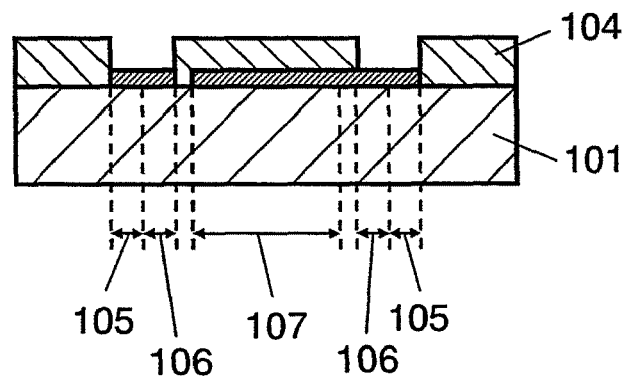
FIG. 3B is a sectional view of the other constitution of the surface acoustic wave resonator according to the preferred embodiment 1.
Figure 4:
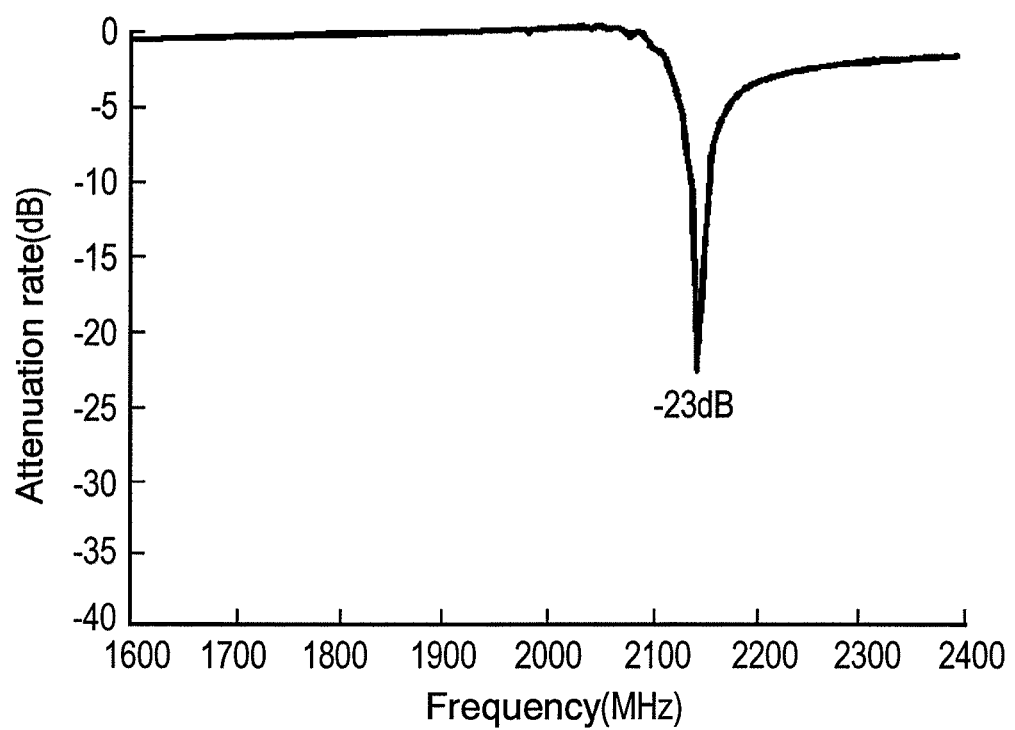
FIG. 4 is an attenuation rate chart of the surface acoustic wave resonator according to the preferred embodiment 1.

In the description of the present preferred embodiment, $SiO_2$ thin film 104 in the upper sections of bus-bar electrode regions 105 in interdigital transducer electrode 102 is removed. A constitution shown in FIGS. 3A and 3B may be adopted. FIG. 3A is a top view of another constitution of the surface acoustic wave resonator according to the preferred embodiment 1. FIG. 3B is a sectional view of 3B-B shown in FIG. 3A. The constitution is different to that of FIG. 1 in that $SiO_2$ thin film 104 in the upper sections of dummy electrode regions 106 of interdigital transducer electrode 102 in the surface acoustic wave resonator is removed. FIG. 4 shows an attenuation rate of the surface acoustic wave resonator thus constituted. In FIG. 4, the maximum attenuation, which is −23 dB, is further improved. Further, the Q value at the anti-resonance point is 245, which also shows the improvement. Thus, the characteristics of the surface acoustic wave resonator can be further improved when $SiO_2$ thin film 104 of dummy electrode regions 106 is removed.

Figure 5A:
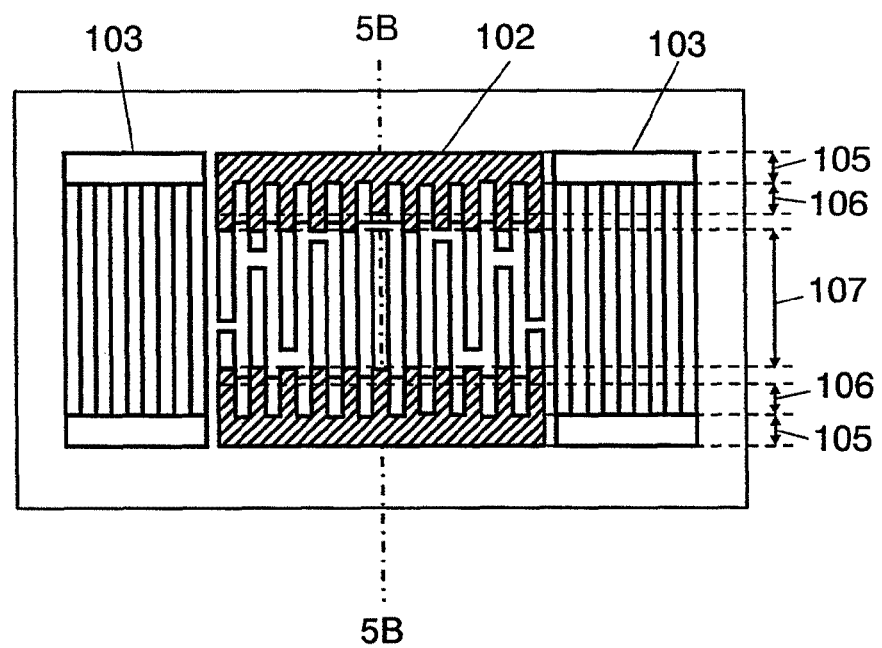
FIG. 5A is a top view of still another constitution of the surface acoustic wave resonator according to the preferred embodiment 1.
Figure 5B:
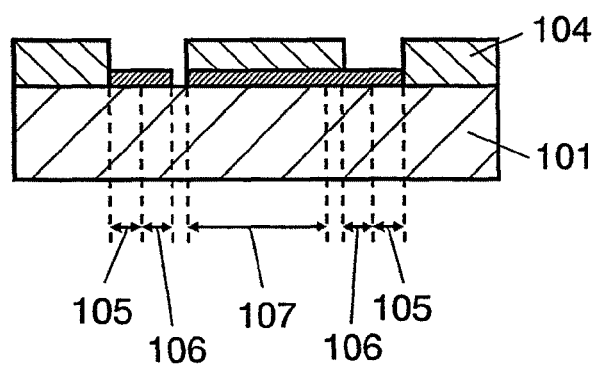
FIG. 5B is a sectional view of still another constitution of the surface acoustic wave resonator according to the preferred embodiment 1.

In the description of the present preferred embodiment, $SiO_2$ thin film 104 in the upper sections of bus-bar electrode regions 105 and dummy electrode regions 106 in interdigital transducer electrode 102 is entirely removed. However, the present preferred embodiment is not limited to the removal in such a manner, and $SiO_2$ thin film 104 in one of the regions may be removed. Further, the surface acoustic wave resonator may be constituted as shown in FIG. 5A. FIG. 5A is a top view showing another constitution of the surface acoustic wave resonator according to the preferred embodiment 1, and FIG. 5B is a sectional view of 5B-5B shown in FIG. 5B. As shown therein, the region where $SiO_2$ thin film 104 is removed may be extended to gap regions between dummy electrode regions 106 and finger overlap region 107 in interdigital transducer electrode 102. In that case, $SiO_2$ thin film 104 is preferably left in the upper section of finger overlap region 107 which is a main propagation path of surface acoustic wave, because the removal of $SiO_2$ thin film 104 in the upper section of finger overlap region 107 may lead to the deterioration of the resonator characteristics. Therefore, $SiO_2$ thin film 104 is preferably removed on dummy electrode region 106 side relative to a maximum crossover width.

In the present preferred embodiment, $SiO_2$ thin film 104 is entirely removed from the upper sections of bus-bar electrode regions 105 or dummy electrode regions 106 in interdigital transducer electrode 102, in other words, the thickness of $SiO_2$ thin film 104 is zero therein. However, the present preferred embodiment is not limited to the removal in such a manner. $SiO_2$ thin film 104 in bus-bar electrode regions 105 may be thinner than $SiO_2$ thin film 104 in the upper section of finger overlap region 107. Any constitution capable of increasing the acoustic velocity of the surface acoustic wave in the surface acoustic wave resonator in comparison to the acoustic velocity in finger overlap region 107 by changing the constitutions of the upper section of finger overlap region 107 and the upper sections of bus-bar electrode regions 105 or dummy electrode regions 106 in the surface acoustic wave resonator is adoptable.

Further, $SiO_2$ thin film 104 in any of the upper sections of bus-bar electrode regions 105 or dummy electrode regions 106 in interdigital transducer electrode 102a is removed. However, $SiO_2$ thin film 104 may be removed from a part thereof. In other words, as far as $SiO_2$ thin film 104 in a part of bus-bar electrode regions 105 or dummy electrode regions 106 in interdigital transducer electrode 102 is removed, or $SiO_2$ thin film 104 is very thin, an effect similar to that of the present invention can be obtained.

Further, in the description of the present preferred embodiment, the $LiNbO_3$ substrate, which is the rotor (rotary) Y-cut substrate having the cut degree of five degrees, is used as piezoelectric substrate 101, and the film thicknesses of the electrode and $SiO_2$ thin film 104 are normalized by the wavelength, which are respectively 8% and 20%. However, the present preferred embodiment is not limited thereto. Further, as far as the cut angle of the $LiNbO_3$ substrate is within the range of approximately −10 to +30 degrees, the surface acoustic wave resonator is superior in its broadband and temperature characteristic can be realized in the case where the surface acoustic wave resonator is constituted as described in the present invention.

The material used for the electrode includes Al as its main constituent in the description. However, the material is not limited thereto. Cu, Au or any other material may be used.

$SiO_2$ thin film 104 is used as the dielectric thin film in the description. However, any other dielectric material or a multilayered structure formed therefrom can also be applied.

Further, the constitution of reflector electrode 103 is not limited to that of the present preferred embodiment.

$SiO_2$ thin film 104 in the upper sections of reflector electrodes 103 in regions corresponding to bus-bar electrode regions 105 and dummy electrode regions 106 in interdigital transducer electrode 102 may be removed or may be thinned. Accordingly, the reduction of the leak of the surface acoustic wave in the transverse direction can be expected.

In the present preferred embodiment, interdigital transducer electrode 102 is apodization-weighted, which, however, may not be limited to the constitution.

Further, in the description of the present preferred embodiment, the surface acoustic wave resonator comprises the reflector electrodes. In the present invention, which is applied to the interdigital transducer electrode, the reflector electrodes are not particularly necessary to obtain the expected effect.

Preferred Embodiment 2

Figure 6A:
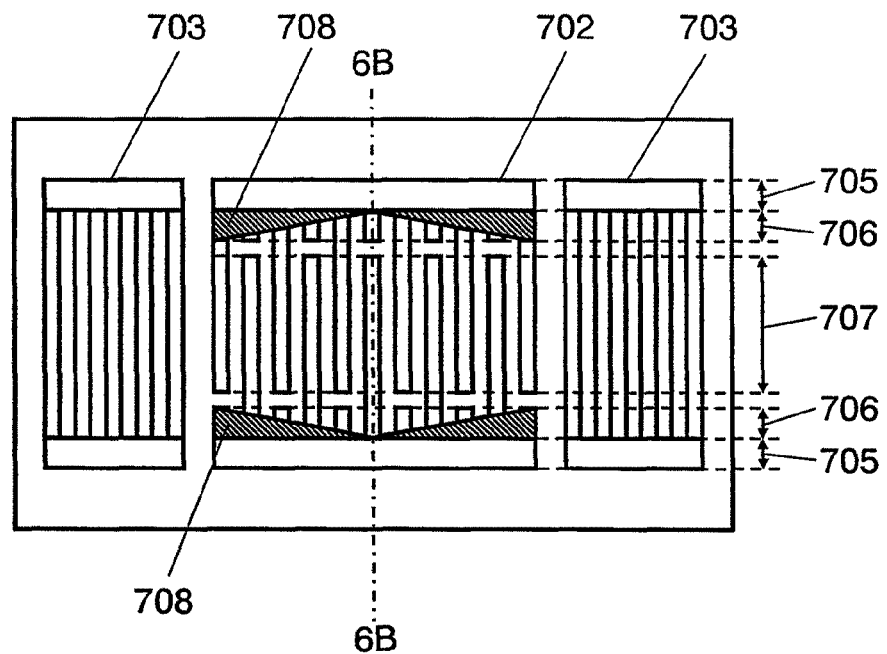
FIG. 6A is a top view of a constitution of a surface acoustic wave resonator according to a preferred embodiment 2 of the present invention.
Figure 6B:
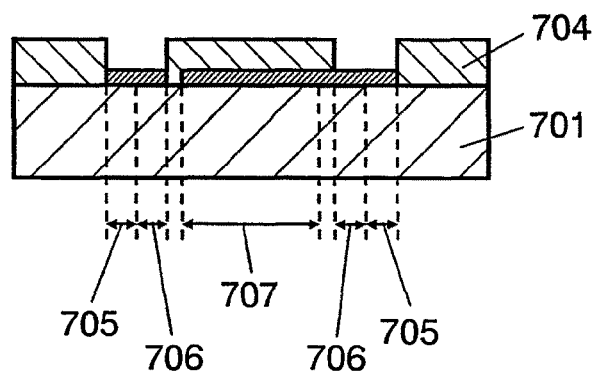
FIG. 6B is a sectional view of the constitution of the surface acoustic wave resonator according to the preferred embodiment 2.

FIG. 6A is a top view showing a constitution of a surface acoustic wave resonator according to a preferred embodiment 2 of the present invention. FIG. 6B is a sectional view of 6B-6B shown in FIG. 6A. Interdigital transducer electrode 702 and reflector electrodes 703 are formed on piezoelectric substrate 701, and $SiO_2$ thin film 704 is further formed thereon. Interdigital transducer electrode 702 includes bus-bar electrode regions 705, dummy electrode regions 706 and finger overlap region 707, wherein the interdigital transducer electrode of the normal type, which is not subjected to the apodized-weighting, is adopted. Dummy electrode region 706 denotes a region representing a minimum length of the dummy electrode in interdigital transducer electrode 702, while finger overlap region 707 denotes region representing a crossover maximum length of the interdigital transducer electrode. To dummy electrode region 706 is applied dummy electrode weighing 708 which is metallized. The metallized region is increased outward from the center, and the length of the dummy electrode is gradually shorter. $SiO_2$ thin film 704 is removed from bus-bar electrode regions 705 and dummy electrodes 706 in interdigital transducer electrode 702 and upper sections thereof.

Figure 7A:
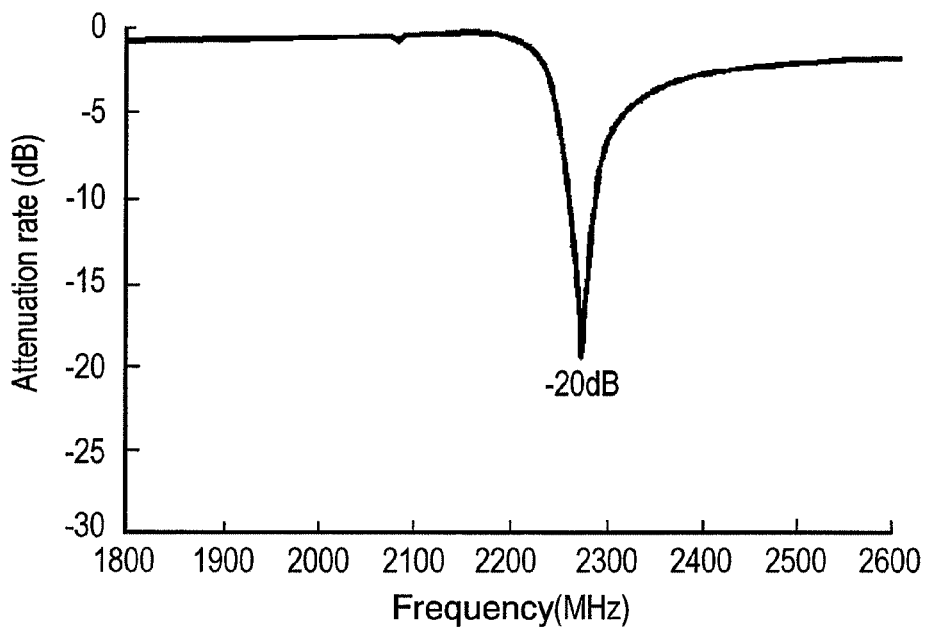
FIG. 7A is an attenuation rate chart of the surface acoustic wave resonator according to the preferred embodiment 2.
Figure 7B:
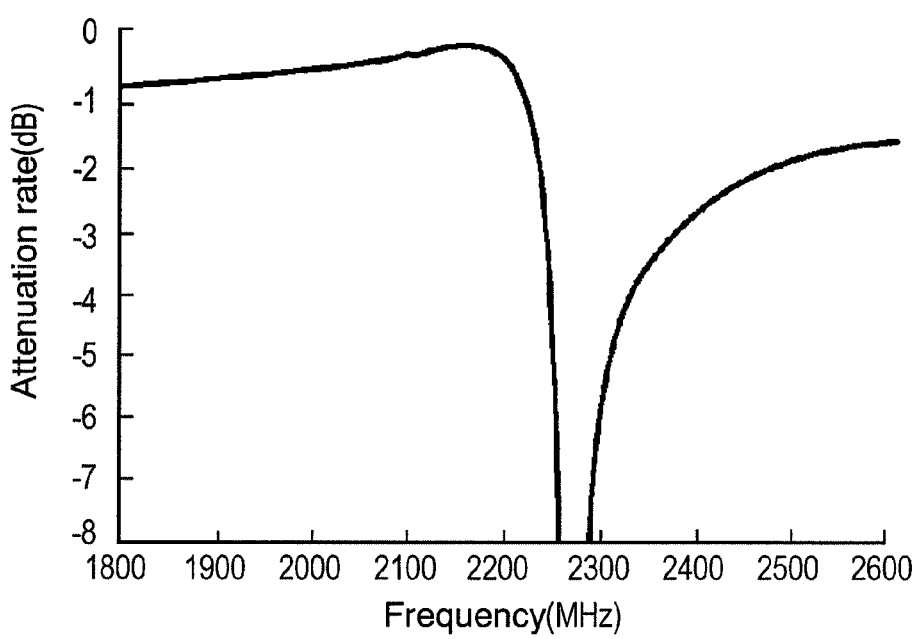
FIG. 7B is an attenuation rate chart of the surface acoustic wave resonator according to the preferred embodiment 2.
Figure 8A:
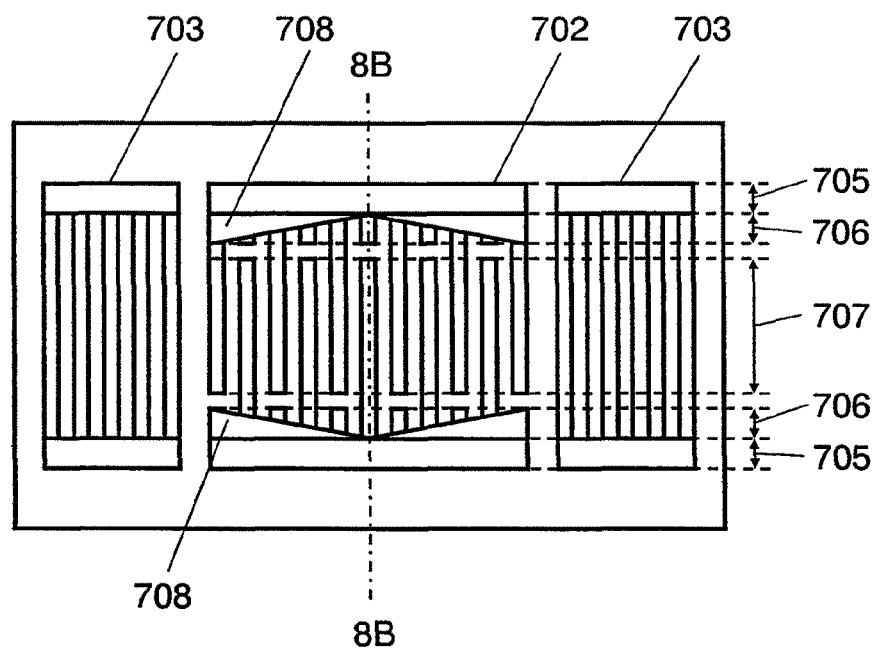
FIG. 8A is a top view showing a constitution of a surface acoustic wave resonator according to the preferred embodiment 2 for comparison.
Figure 8B:
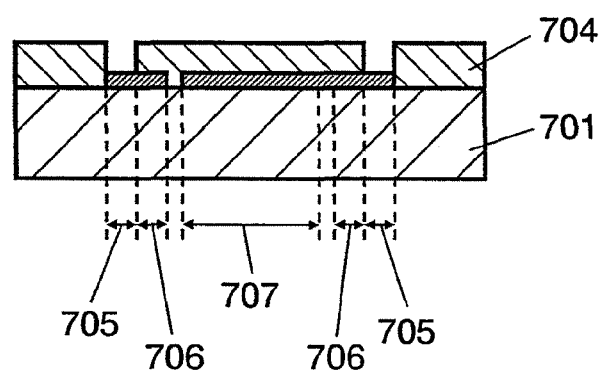
FIG. 8B is a sectional view of a constitution of the surface acoustic wave resonator according to the preferred embodiment 2 for comparison.
Figure 9A:
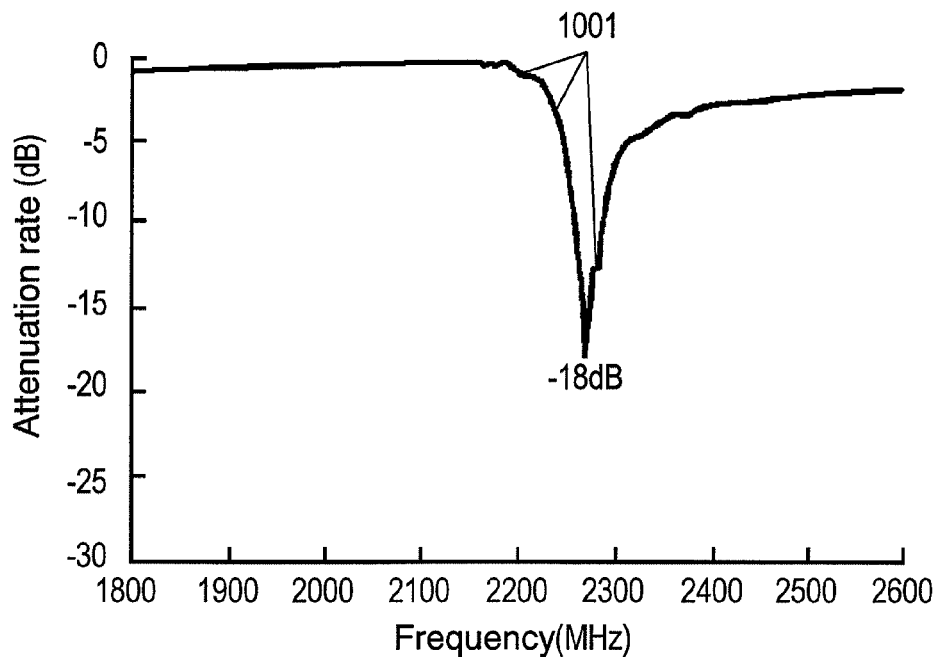
FIG. 9A is an attenuation rate chart according to the preferred embodiment 2 for comparison.
Figure 9B:
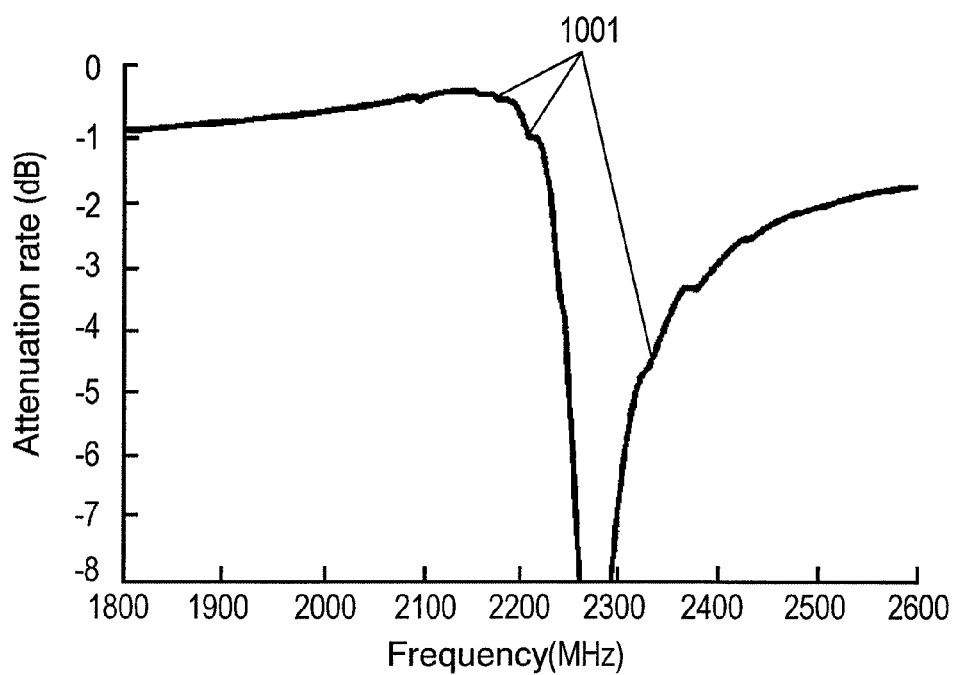
FIG. 9B is an attenuation rate chart according to the preferred embodiment 2 for comparison.

FIGS. 7A and 7B show an attenuation rate of the surface acoustic wave resonator. Specifically, FIGS. 7A and 7B show the attenuation rate of the same surface acoustic wave resonator, and a vertical axis shown in FIG. 7A is enlarged in FIG. 7B. Further, FIGS. 9A and 9B show an attenuation rate of a surface acoustic wave resonator as shown in FIGS. 8A and 8B for comparison. FIG. 8A is a top view showing a constitution of a surface acoustic wave resonator according to the preferred embodiment 2 for comparison. FIG. 8B is a sectional view of 8B-8B shown in FIG. 8A. A vertical axis shown in FIG. 9A is enlarged in FIG. 9B. As the piezoelectric substrate is used the $LiNbO_3$ substrate which is the rotor (rotary) Y-cut substrate having the cut degree of five degrees, and the material including Al as its main constituent is used for the electrode. The film thicknesses of the electrode and the $SiO_2$ thin film are normalized by the wavelength, which are respectively 8% and 20%. In the constitution of the surface acoustic wave resonator according to the present preferred embodiment shown in FIGS. 6A and 6B, $SiO_2$ thin film 704 is removed from dummy electrode regions 706 including metallized dummy electrode weighting 708. In the surface acoustic wave resonator shown in FIGS. 8A and 8B for comparison, $SiO_2$ thin film 704 remains on dummy electrode regions 706 including dummy electrode weighting 708. FIGS. 9A and 9B show the appearance of spurious 1001 in the transverse mode. In FIGS. 7A and 7B, the spurious is controlled, and the superior resonator characteristics are thereby obtained. The maximum attenuation in the surface acoustic wave resonator according to the present invention is −20 dB as shown in FIG. 7A, while the maximum attenuation in the surface acoustic wave resonator for comparison is −18 dB as shown in FIG. 9A. Thus, the improvement of the characteristics of the surface acoustic wave resonator is realized at the same time in the constitution according to the present invention. The possible reason for the improvement is that an acoustic velocity of the surface acoustic wave in dummy electrode regions 706 in the surface acoustic wave resonator is faster than the acoustic velocity in finger overlap region 707 because $SiO_2$ thin film 704 is removed from the upper sections of dummy electrode regions 706, which controls the leak of the surface acoustic wave in the transverse direction, in other words, in the direction of dummy electrode regions 706, thereby allowing the surface acoustic wave to be more effectively contained.

Therefore, the $SiO_2$ thin film is not formed in the upper sections of dummy electrode regions to which metallized dummy electrode weighting 708 is applied in the constitution according to the present invention. Accordingly, the spurious 1001 in the transverse mode can be effectively controlled, and further, the resonator characteristics can be effectively improved.

As shown in the present preferred embodiment, when the spurious in the transverse mode can be controlled by the interdigital transducer electrode of the normal type which is not subjected to the apodized-weighting, the deterioration of the resonator characteristics due to the Q value resulting from the apodized-weighting can be prevented, which is advantageous in terms of the characteristics in order to realize the surface acoustic wave resonator. In order to realize an equal electrostatic capacitance in the surface acoustic wave resonator, the resonator size can be reduced in the case of the surface acoustic wave resonator according to the present invention capable of controlling the spurious in the transverse mode without the apodized-weighting in comparison to the conventional surface acoustic wave resonator subjected to the apodized-weighting. As a result, the surface acoustic wave resonator according to the present invention can be downsized.

As so far described, in the surface acoustic wave resonator according to the present invention, dummy electrode regions 706 in interdigital transducer electrode 702 are weighted, and $SiO_2$ thin films 704 thereon is removed. As a result, the characteristics of the surface acoustic wave resonator can be improved, and the surface acoustic wave resonator which is superior can be realized.

In the description of the present preferred embodiment, $SiO_2$ thin film 704 is removed from the upper sections of dummy electrode regions 706 in interdigital transducer electrode 702. However, $SiO_2$ thin film 704 may be removed from the upper sections of both of dummy electrode regions 706 and bus-bar electrode regions 705.

Further, $SiO_2$ thin film 704 is entirely removed in the description, but the removal may not be necessary. $SiO_2$ thin film 704 in the upper sections of dummy electrode regions 706 may be adapted to be thinner than $SiO_2$ thin film in the upper section of finger overlap region 707. Any constitution capable of increasing the acoustic velocity of the surface acoustic wave in dummy electrode regions 706 in the surface acoustic wave resonator in comparison to the acoustic velocity in finger overlap region 707 by changing the constitutions of the upper section of finger overlap region 707 and the upper sections of dummy electrode regions 706 in the surface acoustic wave resonator is adoptable.

Further, $SiO_2$ thin film 704 in any of the upper sections of dummy electrode regions 706 is removed in the description. However, $SiO_2$ thin film 704 may be removed from a part thereof. In other words, as far as $SiO_2$ thin film 704 in a part of dummy electrode regions 706 is removed, or $SiO_2$ thin film 704 therein is thinned, an effect similar to that of the present invention can be obtained.

In a manner similar to dummy electrode regions 706, $SiO_2$ thin film 704 in a part of bus-bar electrode regions 705 in interdigital transducer electrode 702 may be removed, or $SiO_2$ thin film 704 therein may be thinned.

In the description, the length of dummy electrode is gradually shorter because the shape of dummy weighting is metallized outward from the center. However, the present invention is not limited thereto. In the case where the dummy electrode regions are subjected to some kind of weighting, and $SiO_2$ thin film 704 is removed or thinned, an effect similar to that of the present invention can be obtained.

In the present preferred embodiment, the $LiNbO_3$ substrate, which is the rotor (rotary) Y-cut substrate having the cut degree of five degrees, is used as the piezoelectric substrate, and the film thicknesses of the electrode and $SiO_2$ thin film 704 are normalized by the wavelength, which are respectively 8% and 20%, yet the present invention is not limited thereto. As far as the cut degree of the $LiNbO_3$ substrate is within the range of approximately −10 to +30 degrees, the surface acoustic wave resonator is superior in its broadband and temperature characteristic and can be obtained when the constitution according to the present invention is applied thereto.

Further, the material for the electrode includes Al as its main constituent, but the present invention is not limited thereto. Cu, Au or any other material may be used.

$SiO_2$ thin film 704 is used as the dielectric thin film in the description. However, any other material or a multilayered structure formed therefrom may be adopted.

Reflector electrodes 703 are not necessarily constituted as described above. $SiO_2$ thin film 704 in the upper sections of reflector electrodes 703 in the regions corresponding to bus-bar electrode regions 705 and dummy electrode regions 706 may be removed or thinned. In that case, the reduction of the leak of the surface acoustic wave in the transverse direction in the reflector can be expected.

The electrodes of the normal type are used as interdigital transducer electrode 702 in the present preferred embodiment. However, the apodization-weighted interdigital transducer electrode may be combined. In that case, the control of the spurious can be effectively realized.

In the present preferred embodiment, the surface acoustic wave resonator comprises the reflector electrodes. However, the present invention, which is applied to the interdigital transducer electrode, can achieve the effect without the reflector electrodes.

Figure 11A:
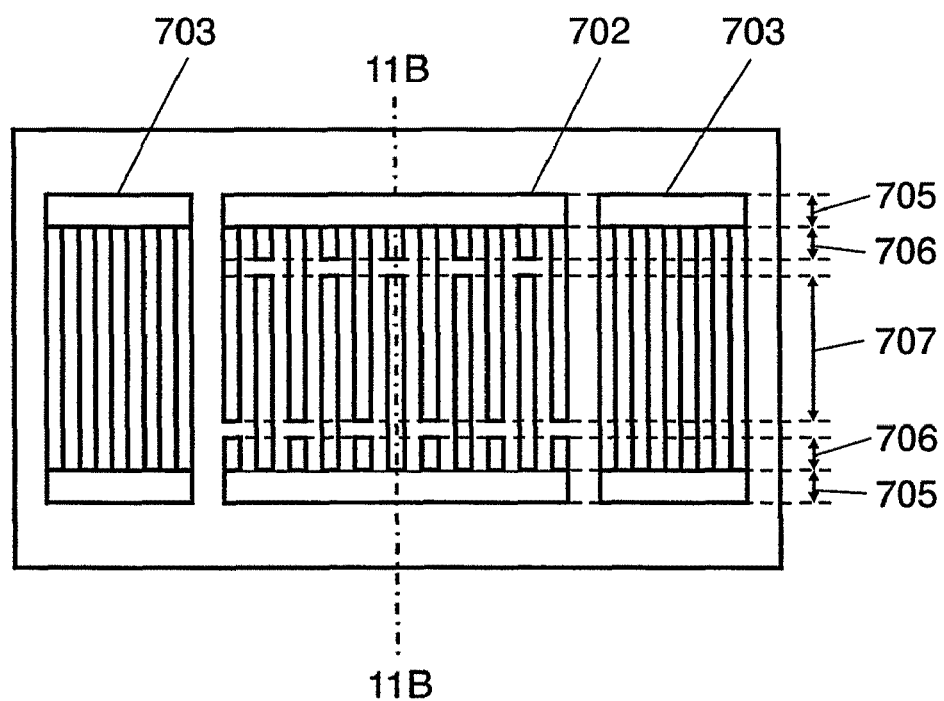
FIG. 11A is a top view of a constitution of the surface acoustic wave resonator according to the preferred embodiment 2.
Figure 11B:
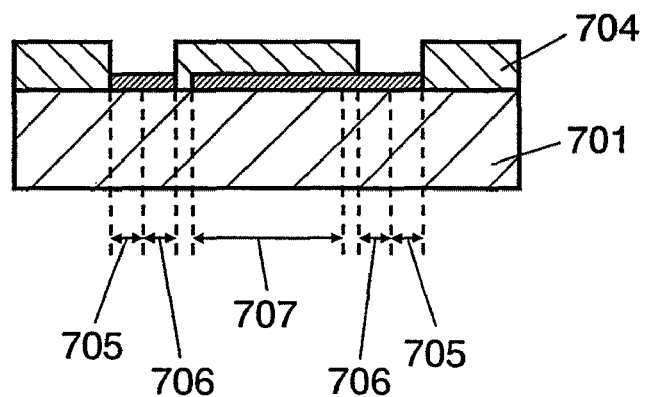
FIG. 11B is a sectional view of the constitution of the surface acoustic wave resonator according to the preferred embodiment 2.
Figure 12A:
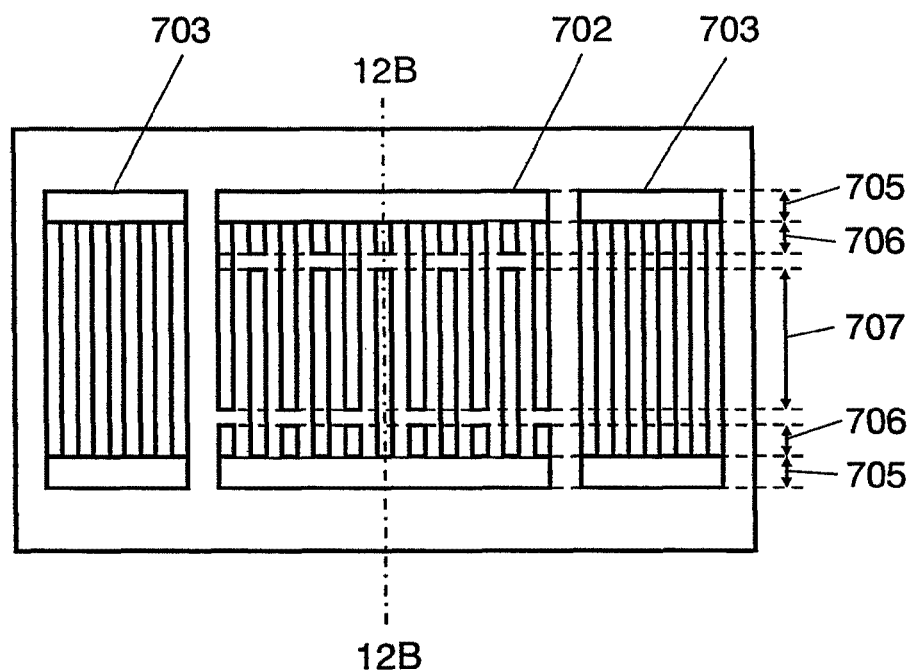
FIG. 12A is a top view of a constitution of the surface acoustic wave resonator according to the preferred embodiment 2 for comparison.
Figure 12B:
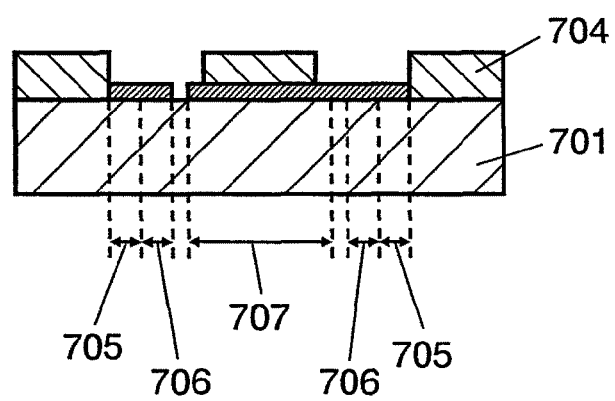
FIG. 12B is a sectional view of the constitution of the surface acoustic wave resonator according to the preferred embodiment 2 for comparison.
Figure 13:
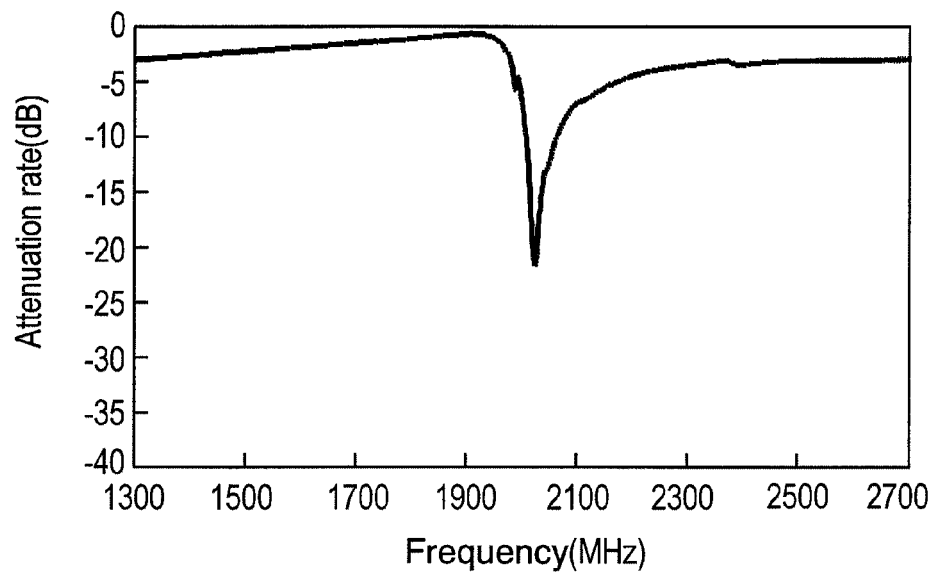
FIG. 13 is an attenuation rate chart of the surface acoustic wave resonator according to the preferred embodiment 2.
Figure 14:
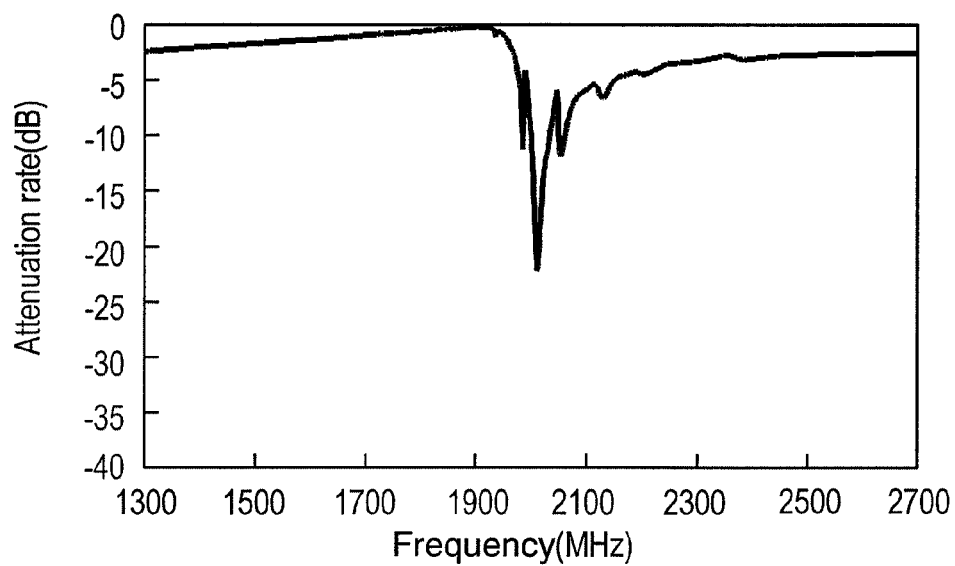
FIG. 14 is an attenuation rate chart of the surface acoustic wave resonator according to the preferred embodiment 2 for comparison.

Next, the region where the dielectric thin film is not formed is described. FIG. 11A is a top view illustrating the constitution of the surface acoustic wave resonator, and FIG. 11B is a sectional view of 11B-11B shown in FIG. 11A. FIG. 12A is a top view showing a constitution of the surface acoustic wave resonator for comparison, and FIG. 12B is a sectional view of 12B-12B shown in FIG. 12A. Two examples were compared to each other, the examples being respectively: the region where the dielectric thin film is not formed is limited to the upper sections of the dummy and bus-bar regions as shown in FIGS. 11A and 11B; and the region where the dielectric thin film is not formed includes a part of the finger overlap region as shown in FIGS. 12A and 12B. The crossover width in the comparison is 25 µm. In FIGS. 12A and 12B, the region where the dielectric thin film is not formed is provided inward of the finger overlap region by 1 µm. In the comparison, the electrode of the normal type not subjected to the dummy electrode weighting was used in the surface acoustic wave resonator. FIG. 13 shows characteristics of the surface acoustic wave resonator shown in FIGS. 11A and 11B. FIG. 14 shows characteristics of the surface acoustic wave resonator shown in FIGS. 12A and 12B. In comparison to the resonator characteristics of the surface acoustic wave resonator shown in FIGS. 11A and 11B, the spurious is increased and the characteristics are degraded in the resonator characteristics of the surface acoustic wave resonator shown in FIGS. 12A and 12B. Therefore, the dielectric thin film is preferably formed over the whole finger overlap region.

Preferred Embodiment 3

Figure 10:
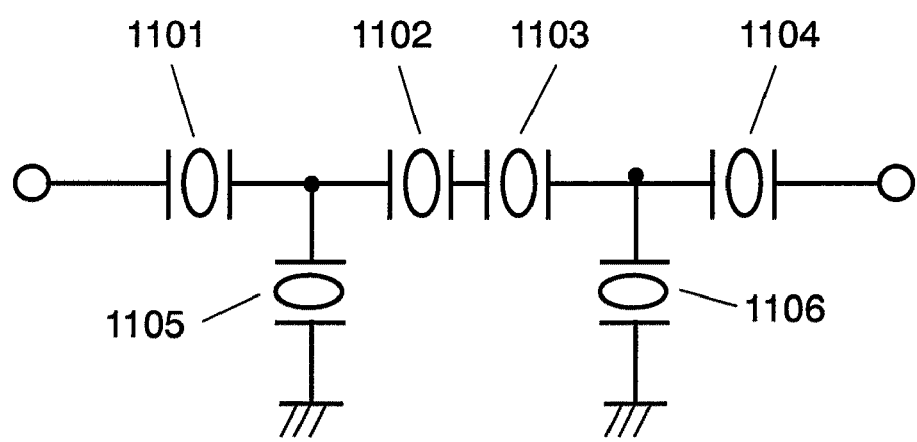
FIG. 10 is a circuit diagram showing a surface acoustic wave filter according to a preferred embodiment 3 of the present invention.

FIG. 10 shows a constitution of a surface acoustic wave filter according to a preferred embodiment 3 of the present invention. Referring to reference symbols shown in FIG. 10, 1101, 1102, 1103 and 1104 denote serial-arm surface acoustic wave resonators, while 1105 and 1106 denote parallel-arm surface acoustic wave resonators. As the surface acoustic wave resonators 1101, 1102, 1103, 1104, 1105 and 1106, the surface acoustic wave resonator shown in the preferred embodiment 1 or 2 is used. Thus, the surface acoustic wave filter of the ladder type having superior characteristics can be realized.

In the present preferred embodiment, the surface acoustic wave filter of the ladder type comprising the six surface acoustic wave resonators 1101, 1102, 1103, 1104, 1105 and 1106 is described. However, the number of the surface acoustic wave resonators to be provided and the constitution of the filter are not limited thereto. As far as the surface acoustic wave resonator constituted as described in the preferred embodiment 1 or 2 is applied to at least one of the surface acoustic wave resonators constituting the surface acoustic wave filter, the expected improvements can be obtained.

In the present invention, when the constitution of interdigital transducer electrode 102 or 702 according to the preferred embodiment 1 or 2 is applied, not only to the surface acoustic wave filter of the ladder type comprising the surface acoustic wave resonators provided with reflector electrodes 103 or 703 on the both sides of interdigital transducer electrode 102 or 702, but also to a longitudinal-coupled mode filter provided with a plurality of interdigital transducer electrodes 102 or 702 adjacent to each other, characteristics of the vertical-mode surface acoustic wave filter can also be effectively improved.

The present invention is not limitedly applied to the surface acoustic wave filter, but is also applicable to an antenna duplexer comprising transmission and reception filter. When the surface acoustic wave resonator or the surface acoustic wave filter according to the present invention is used in one of the transmission and reception filters, the antenna duplexer can realize superior characteristics.

INDUSTRIAL APPLICABILITY

The surface acoustic wave resonator according to the present invention can exert such effects that the leak of the surface acoustic wave in the transverse direction is improved and the surface acoustic wave resonator having the superior characteristics is realized. Further, in the case where the surface acoustic wave filter and the antenna duplexer comprises the surface acoustic wave resonator, the surface acoustic wave filter and the antenna duplexer can effectively obtain the superior characteristics.

The invention claimed is:

1. A surface acoustic wave resonator comprising:
a substrate made of lithium niobate;
an interdigital transducer electrode provided on an upper surface of the substrate; and
a dielectric thin film covering at least a portion of the interdigital transducer electrode,
wherein the interdigital transducer electrode includes a bus-bar electrode region, a dummy electrode region and a finger overlap region, and
wherein (i) a thickness of the dielectric thin film covering at least one of the bus-bar electrode region and the dummy electrode region is smaller than a thickness of the dielectric thin film covering the finger overlap region, or (ii) the thickness of the dielectric thin film covering the at least one of the bus-bar electrode region and the dummy electrode region is zero.

2. The surface acoustic wave resonator as claimed in claim 1, wherein at least one of the bus-bar electrode region and the dummy electrode region is not covered by the dielectric thin film, so as to be exposed out of the dielectric thin film.

3. The surface acoustic wave resonator as claimed in claim 1, wherein the interdigital transducer electrode is apodization-weighted.

4. The surface acoustic wave resonator as claimed in claim 1, wherein the substrate is a rotary Y-cut substrate in which a cut angle is −10 to +30 degrees.

5. The surface acoustic wave resonator as claimed in claim 1, wherein the dielectric thin film is a $SiO_2$ thin film.

6. The surface acoustic wave resonator as claimed in claim 1, wherein the dummy electrode region is subjected to metallized dummy electrode weighting.

7. The surface acoustic wave resonator as claimed in claim 6, wherein the dummy electrode region is not covered by the dielectric thin film, so as to be exposed out of the dielectric thin film.

8. The surface acoustic wave resonator as claimed in claim 6, wherein the finger overlap region is of a normal type, which is not subjected to apodized-weighting.

9. The surface acoustic wave resonator as claimed in claim 6, wherein the substrate is a rotary Y-cut substrate in which a cut angle is −10 to +30 degrees.

10. The surface acoustic wave resonator as claimed in claim 6, wherein the dielectric thin film is a $SiO_2$ thin film.

11. A surface acoustic wave filter comprising a plurality of surface acoustic wave resonators, wherein at least one of the plurality of surface acoustic wave resonators is the surface acoustic wave resonator of claim 6.

12. A surface acoustic wave filter comprising a plurality of surface acoustic wave resonators, wherein at least one of the plurality of surface acoustic wave resonators is the surface acoustic wave resonator of claim 1.

13. An antenna duplexer comprising a transmission filter and a reception filter, wherein the transmission filter or the reception filter is the surface acoustic wave filter of claim 12.

14. A surface acoustic wave resonator comprising:
a substrate made of lithium niobate;
an interdigital transducer electrode provided on an upper surface of the substrate, and
a dielectric thin film covering at least a portion of the interdigital transducer electrode,
wherein the interdigital transducer electrode includes bus-bar electrode regions, dummy electrode regions and a finger overlap region, and
wherein the dielectric thin film does not cover at least one of a bus-bar electrode region of the bus-bar electrode regions and a dummy electrode region of the dummy electrode regions.

15. The surface acoustic wave resonator as claimed in claim 14, wherein a dummy electrode region of the dummy electrode regions is subjected to metallized dummy electrode weighting.

16. A surface acoustic wave filter comprising a plurality of surface acoustic wave resonators, wherein at least one of the plurality of surface acoustic wave resonators is the surface acoustic wave resonator of claim 14.

17. An antenna duplexer comprising a transmission filter and a reception filter, wherein the transmission filter and the reception filter are the surface acoustic wave filter of claim 16.

* * * * *